United States Patent
Min et al.

(10) Patent No.: US 7,820,530 B2
(45) Date of Patent: Oct. 26, 2010

(54) EFFICIENT BODY CONTACT FIELD EFFECT TRANSISTOR WITH REDUCED BODY RESISTANCE

(75) Inventors: Byoung W. Min, Hopewell Junction, NY (US); Stefan Zollner, Hopewell Junction, NY (US); Qingqing Liang, Fishkill, NY (US)

(73) Assignee: Freescale Semiconductor, Inc., Austin, TX (US)

( * ) Notice: Subject to any disclaimer, the term of this patent is extended or adjusted under 35 U.S.C. 154(b) by 85 days.

(21) Appl. No.: 12/243,639

(22) Filed: Oct. 1, 2008

(65) Prior Publication Data
US 2010/0081239 A1  Apr. 1, 2010

(51) Int. Cl.
*H01L 21/20* (2006.01)
*H01L 21/36* (2006.01)

(52) U.S. Cl. .................. 438/479; 438/151; 438/478; 438/517

(58) Field of Classification Search .......... 257/133, 257/258, 344, 347; 438/479, 135, 149
See application file for complete search history.

(56) References Cited

U.S. PATENT DOCUMENTS

| | | | |
|---|---|---|---|
| 5,780,912 | A | 7/1998 | Burr et al. |
| 6,525,381 | B1 | 2/2003 | Long et al. |
| 6,620,656 | B2 | 9/2003 | Min et al. |
| 6,635,542 | B2 | 10/2003 | Sleight et al. |
| 6,724,047 | B2 | 4/2004 | Unnikrishann |
| 6,953,738 | B2 | 10/2005 | Veeraraghavan et al. |
| 7,300,847 | B2 | 11/2007 | Maeda et al. |
| 2003/0201494 | A1* | 10/2003 | Maeda et al. .......... 257/347 |

OTHER PUBLICATIONS

H.F. Wei et al., Improvement of Breakdown Voltage and Off-State Leakage in Ge-Implanted SOI n-MOSFETs, International Electron Devices Meeting, Dec. 5-8, 1993.
Y-C Yeo et al., Effects of High-k Dielectrics on the Workfunctions of Metal and Silicon Gates, 2001 Symposium on VLSI Technology Digest of Technical Papers.
D. Chang et al., Efficacy of Ar in Reducing the Kink Effect on Floating-Body NFD/SOI CMOS, Proceedings 1998 IEEE International SOI Conference, Oct. 1998.
V. M.C. Chen et al., Tunneling Source-Body Contact for Partially-Depleted SOI MOSFET, IEEE Transactions on Electron Devices, vol. 44, No. 7, Jul. 1997.

* cited by examiner

*Primary Examiner*—Thanh V. Pham
*Assistant Examiner*—Errol Fernandes
(74) *Attorney, Agent, or Firm*—Hamilton & Terrile, LLP; Michael Rocco Cannatti

(57) ABSTRACT

A method for forming a body contacted SOI transistor includes forming a semiconductor layer (103) having a body contact region (120), a body access region (121), and an active region (122). An SOI transistor is formed in the active region by etching a metal gate structure (107, 108) to have a first portion (130) formed over the active region, and a second portion (131) formed over at least part of the body access region. By implanting ions (203, 301) at a non-perpendicular angle into an implant region (204, 302) in the body access region so as to encroach toward the active region and/or under the second portion of the etched metal gate structure, silicide (306) may be subsequently formed over the body contact region and the implant region, thereby reducing formation of a depletion region (308) in the body access region.

20 Claims, 6 Drawing Sheets

FIG. 2 -PRIOR ART-

EFFICIENT BODY CONTACT FIELD EFFECT TRANSISTOR WITH REDUCED BODY RESISTANCE

BACKGROUND OF THE INVENTION

1. Field of the Invention

The present invention is directed in general to the field of semiconductor fabrication and integrated circuits. In one aspect, the present invention relates to the formation of a body contact in a field effect transistor.

2. Description of the Related Art

Because of performance limitations associated with conventional field effect transistors formed on bulk semiconductor substrates, semiconductor devices (such as NMOS and PMOS transistors) are increasingly being formed on semiconductor-on-insulator (SOI) substrates in which an active semiconductor layer (in which the transistor devices are formed) is formed over an insulating or dielectric layer (a.k.a., buried oxide layer) which in turn is formed over a bulk semiconductor substrate such that the dielectric layer isolates the active semiconductor layer from the bulk semiconductor substrate. In the active semiconductor layer, SOI transistors are formed by patterning a deposited polysilicon layer over the active semiconductor layer to define gate electrodes that are isolated from the active semiconductor layer by a gate dielectric layer, and then implanting device features (e.g., source/drain regions) around the gate electrodes. Each SOI transistor also generally includes an electrically isolated body formed in the active semiconductor layer and disposed beneath the gate electrode. To operate properly, each SOI transistor should have its p-type or n-type body electrically connected to a fixed potential. One way to connect the body of the SOI transistor to a potential is to provide an edge contact to the body, such as by forming the gate electrode as a T-shaped or H-shaped gate poly layout. For example, FIG. 1 depicts a layout view of a typical SOI body-contacted transistor 10 which includes a T-shaped poly gate. SOI body-contacted transistor 10 includes an active transistor region 12 that overlaps with a body tie contact region 14. In the center of the active transistor region 12, an intrinsic body region 56 may be located having a width dimension 16, designated as $W_1$, and a length dimension 18, designated as $L_1$. In addition, an extrinsic body region 58 may be located adjacent to the intrinsic body region 56 so as to be centered within the body tie region 14 and having a width dimension 20, designated as $W_2$, and a length dimension 22, designated as $L_2$. The depicted SOI body-contacted transistor 10 also includes a gate polysilicon 66 and gate silicide layer 24 over the active transistor region 12, where a portion 26 of the silicided gate 66, 24 overlies a portion of the body tie contact region 14 corresponding to the extrinsic body region 58. SOI body-contacted transistor 10 still further includes a source silicide 28, drain silicide 30, and body tie contact region silicide 32. In addition, the structure of transistor 10 includes implant regions, designated by reference numerals 34 and 36. In one embodiment, the implant regions 34 and 36 correspond to N++ and P++ implant regions, respectively. Contacts 38, 40, 42, and 44 provide electrical connection to the gate, source, drain, and body tie regions, respectively.

FIG. 2 depicts a cross-sectional view 50 of the SOI body-contacted transistor 10 shown in FIG. 1 taken along line 2-2, where the transistor 10 includes an insulator or buried oxide layer 52, trench isolation regions 54, an intrinsic body region 56 in the active transistor region 12, an extrinsic body tie access region 58 in the active transistor region 12, and a body tie diffusion region 60. As shown, the depicted intrinsic body region 56 includes a P type region, the extrinsic body tie access region 58 includes a P-type region, and the body tie diffusion 60 includes a P++ region. A thin gate oxide 64 overlies the active transistor region 12 in an area underlying the gate polysilicon 66. After forming sidewall spacers 72 at end regions of the gate polysilicon 66, the N++ portion 68 and a P++ portion 70 of the gate poly 66 are formed with N++ and P++ implantations in regions 34 and 36, respectively. Silicide regions 24, 28, 30, 32 are subsequently formed, followed by deposition of an interlevel dielectric $ILD_0$ 74 and formation of contacts 38, 40, 42, 44.

During device operation, a depleted portion 62 of the extrinsic body tie access region 58 is formed which causes a higher body tie resistance condition, resulting in a degraded body tie efficiency. And as the size and scaling of semiconductor device technology is reduced, the reduced thickness of the gate dielectric layer 64 results in greater depletion 62 of the body access region 58, which further increases body resistance and threshold voltages for the SOI transistors which can be especially problematic for analog devices. And with smaller semiconductor devices, aspects of device design and fabrication that previously gave rise to only second-order effects in long-channel devices can no longer be ignored. For example, the reduced scaling of channel length and gate oxide thickness in a conventional MOS transistor exacerbates problems of polysilicon gate depletion, high gate resistance, high gate tunneling leakage current and dopant (i.e., boron) penetration into the channel region of the device.

Accordingly, there is a need for improved semiconductor processes and devices to overcome the problems in the art, such as outlined above. Further limitations and disadvantages of conventional processes and technologies will become apparent to one of skill in the art after reviewing the remainder of the present application with reference to the drawings and detailed description which follow.

BRIEF DESCRIPTION OF THE DRAWINGS

The present invention may be understood, and its numerous objects, features and advantages obtained, when the following detailed description is considered in conjunction with the following drawings, in which.

Figure 1:
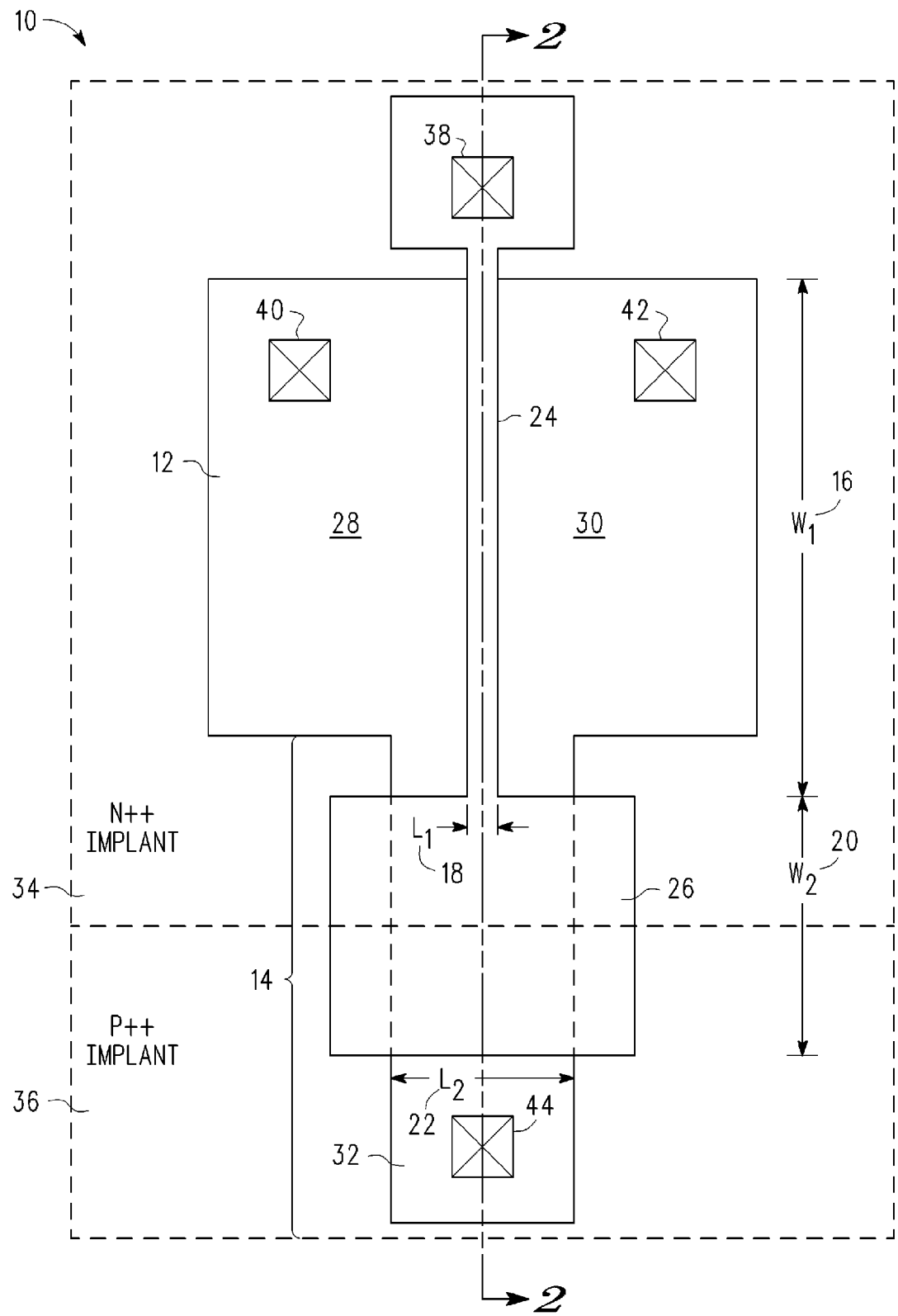
FIG. 1 is a layout view of a conventional SOI body-contacted polysilicon gate transistor.
Figure 2:
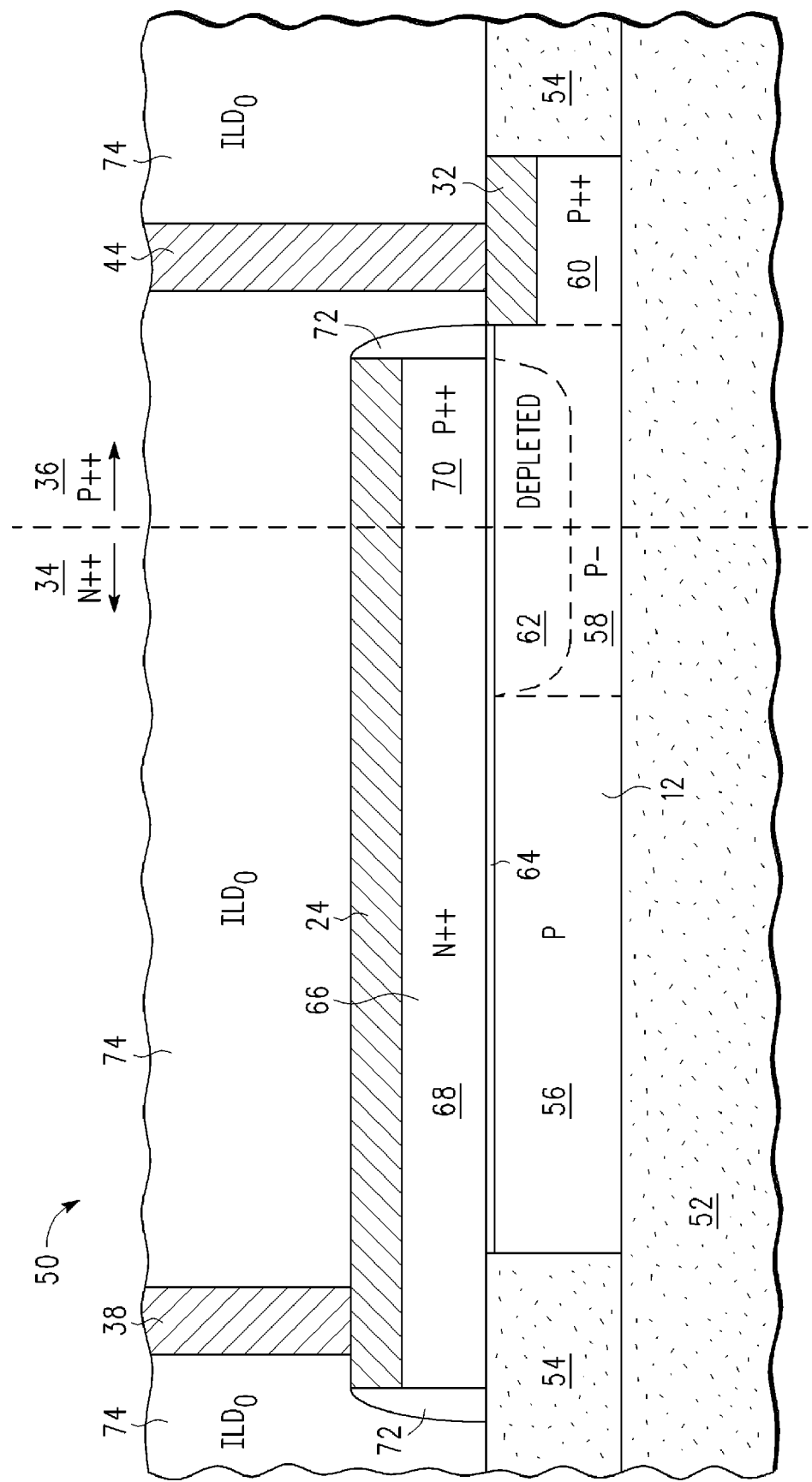
FIG. 2 is a cross-sectional view of the SOI body-contacted polysilicon gate transistor of FIG. 1, taken along line 2-2.

It will be appreciated that for simplicity and clarity of illustration, elements illustrated in the drawings have not necessarily been drawn to scale. For example, the dimensions of some of the elements are exaggerated relative to other elements for purposes of promoting and improving clarity and understanding. Further, where considered appropriate, reference numerals have been repeated among the drawings to represent corresponding or analogous elements.

DETAILED DESCRIPTION

A semiconductor fabrication process and resulting integrated circuit are described for manufacturing metal gate body-contacted transistor devices, such NMOS or PMOS transistors, over an SOI substrate layer having a lightly doped body region and a body tie access region having reduced body resistance. The method includes forming a metal-based gate electrode and high-k dielectric layer over the SOI substrate to define a source region, a drain region, and a body contact region. In selected embodiments, the method includes selectively counter-doping part of the metal-based gate electrode and body contact region with an implant species having the opposite conductivity type from the remainder of the gate electrode, thereby increasing the voltage threshold Vt in the body access region while lowering the depletion and body contact resistance. In other embodiments, the method includes selectively implanting part of the body contact region with an amorphizing implant species, thereby increasing subsequent silicide encroachment into the open body access region and reducing the body contact resistance. In still further embodiments, the method includes recessing the body contact region before siliciding the body contact region, thereby increasing subsequent silicide encroachment into the open body access region and reducing the body contact resistance.

Various illustrative embodiments of the present invention will now be described in detail with reference to the accompanying figures. While various details are set forth in the following description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are depicted with reference to simplified cross sectional drawings of a semiconductor device that are not necessarily drawn to scale and that do not include every device feature or geometry in order to avoid limiting or obscuring the present invention. Such descriptions and representations are used by those skilled in the art to describe and convey the substance of their work to others skilled in the art.

In addition, although specific example materials are described herein, those skilled in the art will recognize that other materials with similar properties can be substituted without loss of function. It is also noted that, throughout this detailed description, certain materials will be formed and removed to fabricate the semiconductor structure. Where the specific procedures for forming or removing such materials are not detailed below, conventional techniques to one skilled in the art for growing, depositing, removing or otherwise forming such layers at appropriate thicknesses shall be intended. Such details are well known and not considered necessary to teach one skilled in the art of how to make or use the present invention.

Figure 3:
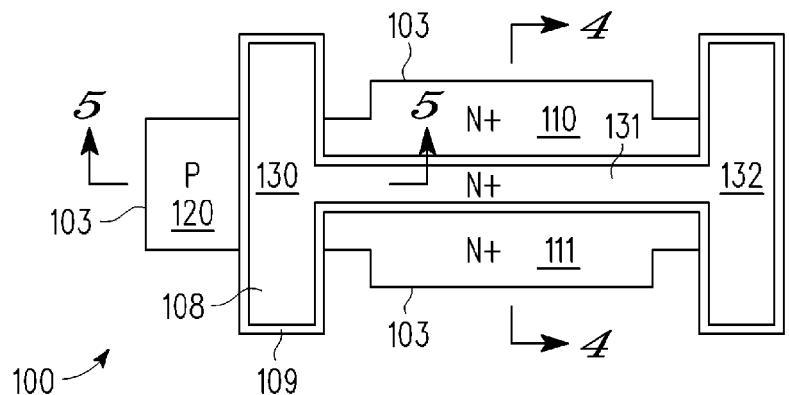
FIG. 3 illustrates a partial layout view of a semiconductor wafer structure in which a semiconductor-on-insulator (SOI) semiconductor device is formed.
Figure 4:
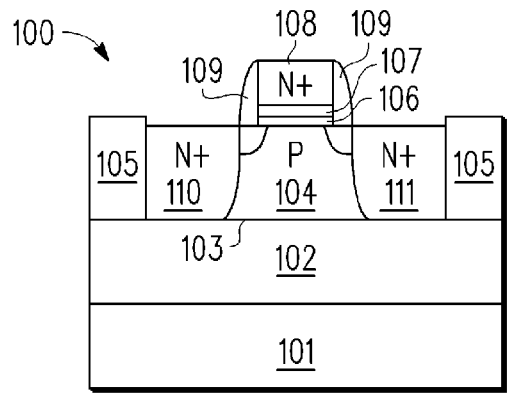
FIG. 4 is a cross-sectional view of the SOI semiconductor device illustrated in FIG. 3 taken along the line 4-4.
Figure 5:
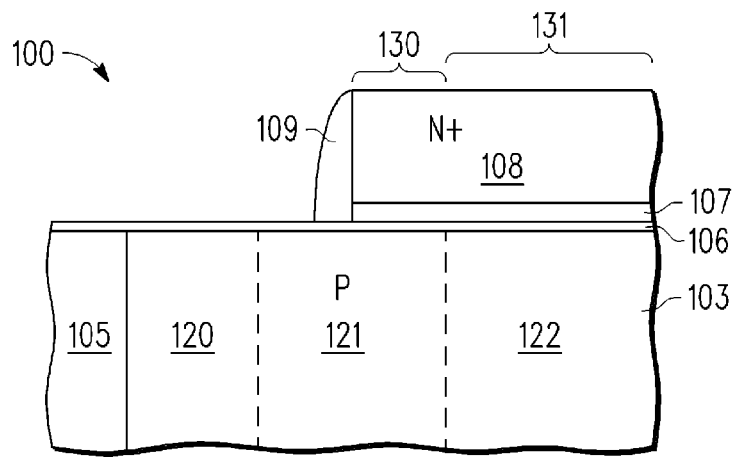
FIG. 5 is a cross-sectional view of the SOI semiconductor device illustrated in FIG. 3 taken along the line 5-5.

Referring now to FIG. 3, there is shown a partial layout view of a semiconductor wafer structure 100 in which a semiconductor-on-insulator (SOI) semiconductor device is formed. In addition, FIG. 4-5 show cross-sectional views of the SOI semiconductor device illustrated in FIG. 3 taken along the lines 4-4 and 5-5, respectively. The depicted semiconductor wafer structure 100 includes a semiconductor layer 103 formed over an electrical insulator 101 which in turn is formed over a semiconductor substrate 101. Depending on the type of transistor device being fabricated, the semiconductor substrate 101 may be formed from any semiconductor material, including, for example, Si, SiC, SiGe, SiGeC, Ge, GaAs, InAs, InP as well as other III/V or II/VI compound semiconductors or any combination thereof. The insulator layer 102 may be formed on the semiconductor substrate 101 as the buried oxide (BOX) layer using silicon dioxide or other suitable insulating material that is grown, deposited, and/or implanted. Finally, the semiconductor layer 103 is formed over the insulator layer 102 from a semiconductor material having single crystallographic orientation which may be the same as or different from the crystallographic orientation of the semiconductor substrate 101. Depending on the type of transistor device being fabricated, the semiconductor layer 103 may be formed from any semiconductor material, including, for example, Si, SiC, SiGe, SiGeC, Ge, GaAs, InAs, InP as well as other III/V or II/VI compound semiconductors or any combination thereof, and may be formed as a strained semiconductor layer. The wafer structure 100 is commonly known as semiconductor on insulator (SOI) structure, and it will be appreciated that any of a variety of fabrication sequences can be used to form the semiconductor wafer structure 100. Though not explicitly shown, those skilled in the art will appreciate that the semiconductor wafer structure 100 may be formed by bonding a donor wafer to a handle wafer. With this technique, a handle wafer is processed to include the substrate layer 101 as the bulk portion of a stack including at least part of the dielectric layer 102 formed on the substrate layer 101. In addition, a donor wafer is processed to form a stack including at least part of the dielectric layer 102 and the semiconductor layer 103. By bonding the dielectric layer 102 portion of a donor wafer to the dielectric layer portion of the handling wafer, the semiconductor wafer structure 100 is formed.

In the semiconductor substrate 103, one or more isolation regions 105 (such as shallow trench isolation regions or other suitable isolating structures) are formed in the active region to define and isolate adjacent active regions. The active region includes an intrinsic body region 104 which is lightly doped with a material having a p-type conductivity in preparation for forming an n-type MOSFET device (though it will be appreciated that p-type MOSFET devices may also be constructed by reversing the conductivity types of the relevant device regions). In addition, an SOI body-contacted transistor is formed over the active region by forming a metal gate electrode from an insulated gate stack of polysilicon and one or more metal layers. To form the metal gate electrode, one or more insulator or dielectric layers 106 are formed by depositing or growing an insulator or high-k dielectric (e.g., silicon dioxide, oxynitride, metal-oxide, nitride, etc.) over the semiconductor substrate 103 using chemical vapor deposition (CVD), plasma-enhanced chemical vapor deposition (PECVD), physical vapor deposition (PVD), atomic layer deposition (ALD), thermal oxidation, or any combination(s) of the above. In an illustrative implementation, first dielectric layer 106 is a metal-oxide compound formed by chemical vapor deposition, physical vapor deposition, or by atomic layer deposition having a typical final thickness is in the range of 0.1-10 nanometers, though other thicknesses may be used. A suitable metal oxide compound for use as first dielectric layer 106 is hafnium oxide (preferably $HfO_2$), though other oxides, silicates or aluminates of zirconium, aluminum, lanthanum, strontium, tantalum, titanium and combinations thereof may also be used, including but not limited to $Ta_2O_5$, $ZrO_2$, $HfO_2$, $TiO_2$, $Al_2O_3$, $Y_2O_3$, $La_2O_3$, $HfSiO_x$, $ZrSiO_x$, $ZrHfO_x$, $LaSiO_x$, $YSiO_x$, $ScSiO_x$, $CeSiO_x$, $HfLaSiO_x$, $HfAlOX$, $ZrAlO_x$, and $LaAlO_x$. In addition, multi-metallic oxides (for example barium strontium titanate, BST) may also provide high-k dielectric properties.

After forming the first dielectric layer 106, one or more metal or metal-based layers 107 are formed using any desired deposition or sputtering process, such as CVD, PECVD, PVD, ALD, molecular beam deposition (MBD) or any combination(s) thereof. The first metal-based layer(s) 107 may include a metal layer (such as TaC), alone or in combination with a transition or barrier layer metal that includes an element selected from the group consisting of Ta, Ir, Mo, Ru, W, Os, Nb, Ti, V, Ni, and Re. For example, the metal-based gate layer 107 may be formed over the first dielectric layer 106 using an atomic layer deposition (ALD) process that forms a TaC layer having a thickness of approximately 20-70 Angstroms, though other metallic gate layer materials (such as MoN) or even a conductive metal oxide (such as $IrO_2$) with different thicknesses may be used. In addition, a conductive or silicon containing layer 108, such a polysilicon, is deposited over the metal-based layer(s) 107 using CVD, PECVD, PVD, ALD, or any combination(s) thereof to a thickness in the range of approximately 10-150 nanometers, though other materials (e.g., NMOS or PMOS metals) and thicknesses may be used. At this point or subsequently, the conductive or silicon containing layer(s) 108 may be heavily doped with an n-type or p-type dopant, depending on the device type.

The unetched gate stack 107, 108 is subsequently patterned and etched to form an etched gate electrode stack 107, 108, which is shown in plan view in FIG. 3 and in cross section in FIGS. 4 and 5. As illustrated, a first portion 131 of the etched gate electrode stack 107, 108 overlies the active transistor body region 122 and defines on each side the source/drain region 110, 110 in the semiconductor layer 103. In addition, a second portion 130 of the etched gate electrode stack 107, 108 overlies at least part of the body access region 121. Finally, a third portion 132 of the etched gate electrode stack 107, 108 overlying the semiconductor layer 103 is used to provide a gate contact region. While the etched gate electrode stack 107, 108 is illustrated as being formed with a T-shaped or H-shaped configuration, it will be appreciated that any suitable geometric configuration may be used. However formed, the etched gate electrode stack 107, 108 leaves exposed at least the intended source/drain implant regions 110, 111, the body contact region 120, and part of the body access region 121 in the semiconductor layer 103. The exposed body contact region 120 is electrically coupled to transistor body region 122 through the body access region 121, at least part of which is controlled by the second portion 130 of the etched gate electrode stack 107, 108. While only a single transistor body contact region 120 is shown, it will be appreciated that an additional transistor body region can be provided on the opposite side of the first portion 131 of the etched gate electrode stack 107, 108. And though not shown, it will be appreciated that the area of the second portion 130 of the etched gate electrode stack 107, 108 may be minimized to reduce the parasitic capacitance and minimize gate electrode leakage to the body access region 121.

Once the etched gate electrode stack 107, 108 is formed, lightly doped source/drain implant regions (shown as protruding from the source/drain regions 110, 111) may be implanted into the active region 122 using the etched gate electrode stack 107, 108 (and any necessary patterned photoresist layers) as an implant mask, followed by formation of sidewall spacers 109 on the sidewalls of the etched gate electrode stack 107, 108. As will be appreciated, the sidewall spacers 109 may be formed by growing or depositing one or more dielectric layers (e.g., silicon dioxide or silicon nitride), and then anisotropically etching the dielectric layer(s) to form the sidewall spacers 109. After forming the sidewall spacers 109, heavily doped source/drain implant regions 110, 111 may be implanted into the active region 122 of the semiconductor layer 103 using the etched gate electrode stack 107, 108 and sidewall spacers 109 (and any necessary patterned photoresist layers) as an implant mask. In selected embodiments, the implant regions 110, 111 shown in FIGS. 3-4 correspond to N++ source and drain implant regions, respectively, which may be implanted with n-type impurities using an implant mask (not shown) which protects other areas (e.g., the body contact region 120 and body access region 121) during the N++ source/drain implantation.

Figure 6:
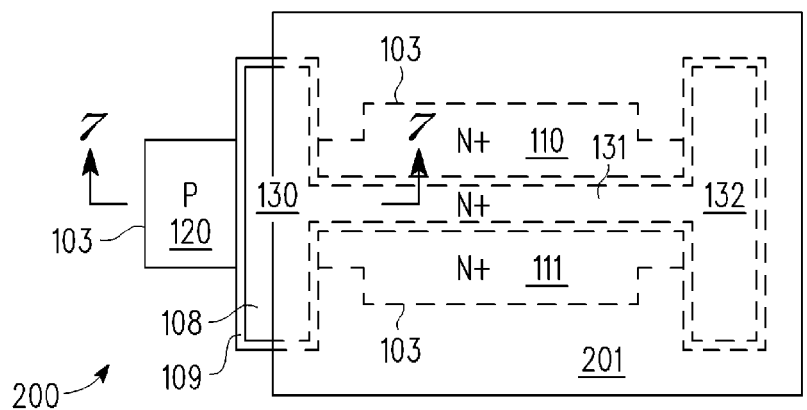
FIG. 6 illustrates processing subsequent to FIG. 3 after a patterned implant mask is formed over the semiconductor wafer structure to partially expose the metal gate layer.

Turning now to FIG. 6, there is illustrated processing of the semiconductor wafer structure 200 subsequent to FIG. 3 after a patterned implant mask or photoresist layer 201 is formed in accordance with selected embodiments of the present invention. As formed, the implant mask 201 defines an opening to expose the body contact region 120 and at least part of the second portion 130 of the etched gate electrode stack 107, 108. While any desired masking, patterning and etching steps may be used, in a selected illustrative embodiment, a layer of photoresist coat (e.g., approximately 1400-3000 Å) may be applied over the semiconductor structure 200, though an organic anti-reflective coating (ARC) layer or soluble bottom anti-reflective coating (BARC) layer may also be used. Alternatively, the implant mask 201 may be formed by growing or depositing a first oxide layer (e.g., pad oxide) and a nitride mask layer over the semiconductor wafer structure 200, and then selectively etching the mask layers to define mask openings using any desired patterning and etch sequence, including but not limited to depositing, patterning and etching a photoresist or hard mask layer. The portions of the body contact region 120 and etched gate electrode stack 107, 108 exposed by the implant mask 201 are shown in the cross-sectional view of FIG. 7 which depicts the semiconductor wafer structure 200 from FIG. 6 taken along the line 7-7.

Figure 7:
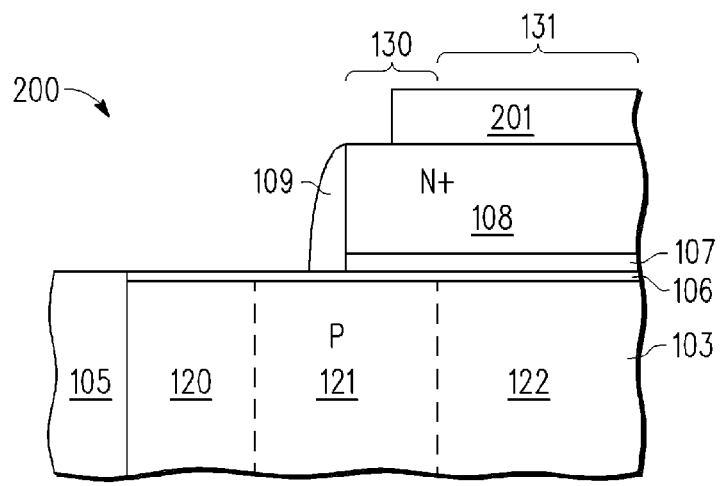
FIG. 7 is a cross-sectional view of the SOI semiconductor device illustrated in FIG. 6 taken along the line 7-7.
Figure 8:
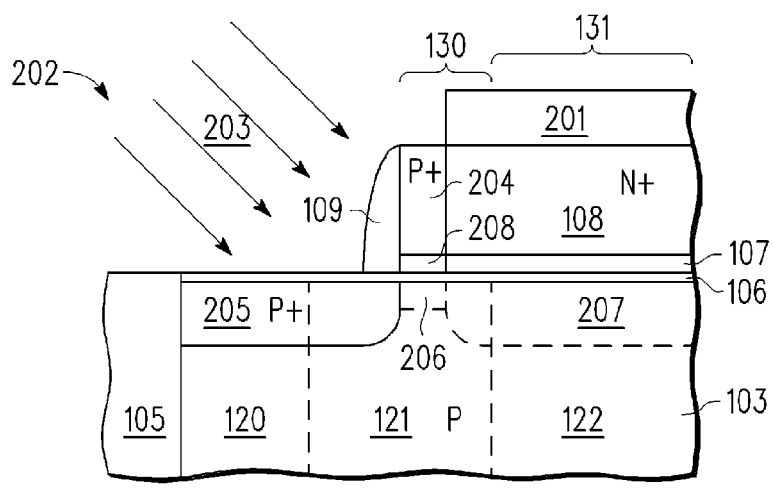
FIG. 8 illustrates processing subsequent to FIG. 7 during which the semiconductor wafer structure is selectively implanted to change the work function of the metal gate.

FIG. 8 illustrates processing subsequent to FIG. 7 during which the semiconductor wafer structure 202 is selectively implanted with an angled implantation process 203 to change the work function of the etched gate electrode stack 107, 108. In an example embodiment where the poly layer 108 has been formed as a heavily doped n-type layer, the implant mask 201 is used to form the SOI body-contacted transistor by masking P+ implant material 203 from at least the first portion 131 of the etched gate electrode stack 107, 108, as well as the source region 110 and drain region 111. Depending on the implant conditions, the concentration profile of the p-type implanted species 203 will create a p-type portion 208 of the metal layer and a p-type implant region 204 in the second portion 130 of the etched gate electrode stack 107, 108 overlying at least part of the body access region 121. In addition, the p-type implanted species 203 will create a p-type implant region 205 at a predetermined depth in the semiconductor layer 103 that may, but need not necessarily, extend all the way to the underlying buried oxide layer. In a selected embodiment, a heavy p-type implant species 203, such as boron, is implanted at an angle with an implant energy of approximately 15-20 KeV keV and a dosage of approximately 1E15 $cm^{-2}$, though other implant energies and dosages may be used as desired, depending on the thickness of the semiconductor layer 103.

By implanting the p-type impurities at an angle, the p-type implant region 205 effectively extends the body contact region 120 laterally into the body access region 121, thereby reducing the body resistance by shrinking the size of the depletion region 206. In addition, the implanted p-type impurities effectively counter-dope the p-type implant region 204 in the etched gate electrode stack 107, 108 to be opposite the doping type of the main gate over the active region. As shown in FIG. 8, the angled implants penetrate through the sidewall spacer 109 to change the work function of the metal gate electrode by forming the p-type implant region 204 and doping the metal layer 107 therebelow. The counter-doping also increases the threshold voltage Vt in the body access region 121. In addition, the presence of the counter-doped implant region 204 in the etched gate means that, during device operation, the body access region 121 has a smaller depletion region (designated by reference numeral 206) than would be the case with an n-doped gate electrode (designated by reference numeral 207), thereby substantially reducing body tie access resistance and resulting in substantially improved body tie efficiency.

As will be appreciated, other techniques besides implantation may be used to form the regions 204, 205, 208. For example, the doping can be achieved by deposition of a doping material, such as Mo, La, Zr, etc., over the exposed portions of the etched gate electrode stack and the semiconductor layer 103. And while selected embodiments are described with reference to an NMOS transistor, it will be appreciated that the disclosed techniques may also be applied during formation of PMOS transistors by reversing the polarity of the regions 204, 205, 208 to N+ in relation to an unetched gate stack which includes a P+ semiconductor layer 108.

Once the p-type implant regions 204, 205 are doped, the implant mask 201 may be removed and the dopants may be activated with an annealing heat process. At the same time or subsequently, thin silicide layers may be formed in the appropriate contact regions, such as the upper surface of the P+ implant region 205, as well as the gate, source, and drain contact regions (not shown).

While an angled counter-doping implantation sequence can be used to change the metal work function over the body access region as described herein, it will be appreciated that other techniques can be used to counter-dope the portion of the etched gate electrode over the body access region. For example, when a CMOS fabrication process is used which has distinct processing steps for separately forming n-type and p-type metal gate electrodes, the distinct processing steps may be applied to fabricate a patterned metal gate electrode which has an n-type metal gate electrode structure over the active transistor body region 122 and a p-type metal gate electrode structure over the body access region 121.

Figure 9:
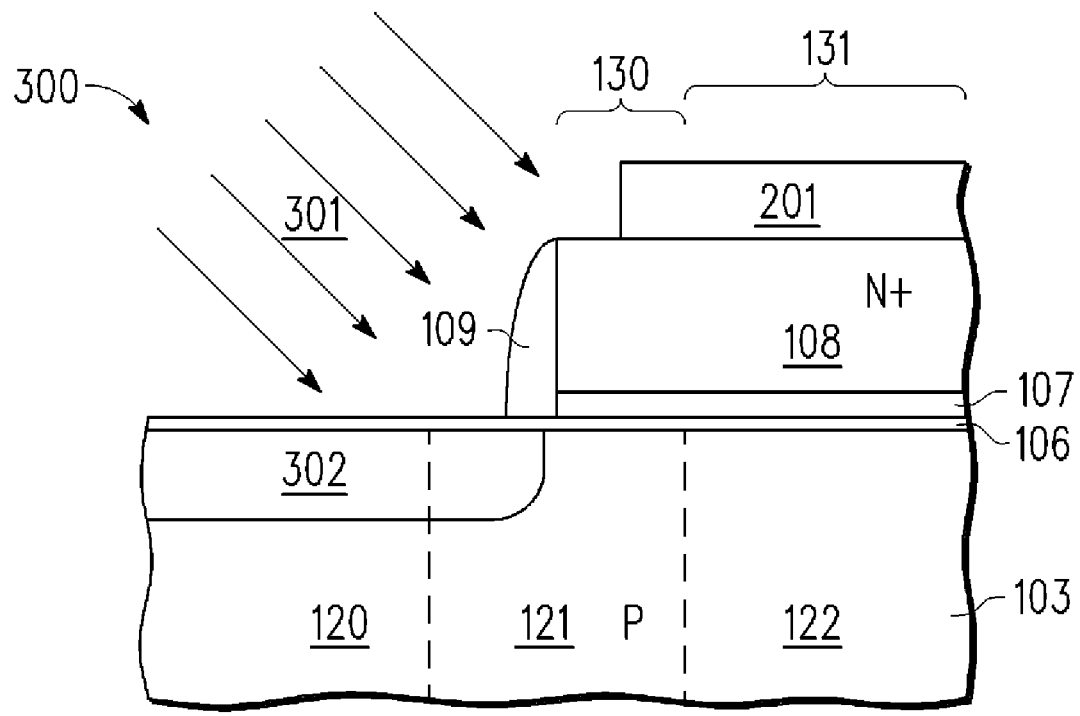
FIG. 9 illustrates processing subsequent to FIG. 7 in accordance with selected alternate embodiments wherein the semiconductor wafer structure is selectively implanted to amorphize an open body access region prior to forming silicide regions.

Turning now to FIG. 9, there is illustrated processing of the semiconductor wafer structure 300 subsequent to FIG. 7 in accordance with selected alternate embodiments wherein the semiconductor wafer structure 300 is selectively implanted 301 to amorphize part of the open body access region 121 to promote subsequent silicide encroachment. As illustrated, the exposed portions of the semiconductor wafer structure 300 may be amorphized by implantation with a heavy ion species 301, such as Xe, Ge, Ar, In, Sb, As, P, $BF_2$, Si, or another amorphizing heavy ion species. By implanting a heavy ion species into the semiconductor layer 103 at an angle, the amorphized implanted region 302 extends laterally into the body access region 121. Another advantage of implanting neutral or inert heavy ions is that the implanted regions 302 of the semiconductor layer 103 remain undoped (or no additional doping is added to the original doping level of the layer 103). In a selected embodiment, a heavy implant species 301, such as xenon, is implanted with an implant energy of approximately 30 keV and a dosage of approximately 1E15 $cm^{-2}$ though other implant energies and dosages may be used as desired, depending on the thickness of the semiconductor layer 103. However, in selected embodiments, the implanted regions 302 may be amorphized by implanting an appropriate conductive doping species (e.g., As) to provide a predetermined level of doping to control a device characteristic. In either case, the implantation of ions to amorphize the implanted regions 302 creates vacancies that help the subsequently formed silicide regions to extend the body contact region 120 laterally into the body access region 121, thereby reducing the body resistance by shrinking the size of the depletion region 206. Though not shown, the amorphous phase of the implanted regions 302 may be subsequently converted into a monocrystalline phase by applying one or more thermal anneal processes to anneal the implanted regions 306 after or as part of forming the silicide regions.

Figure 10:
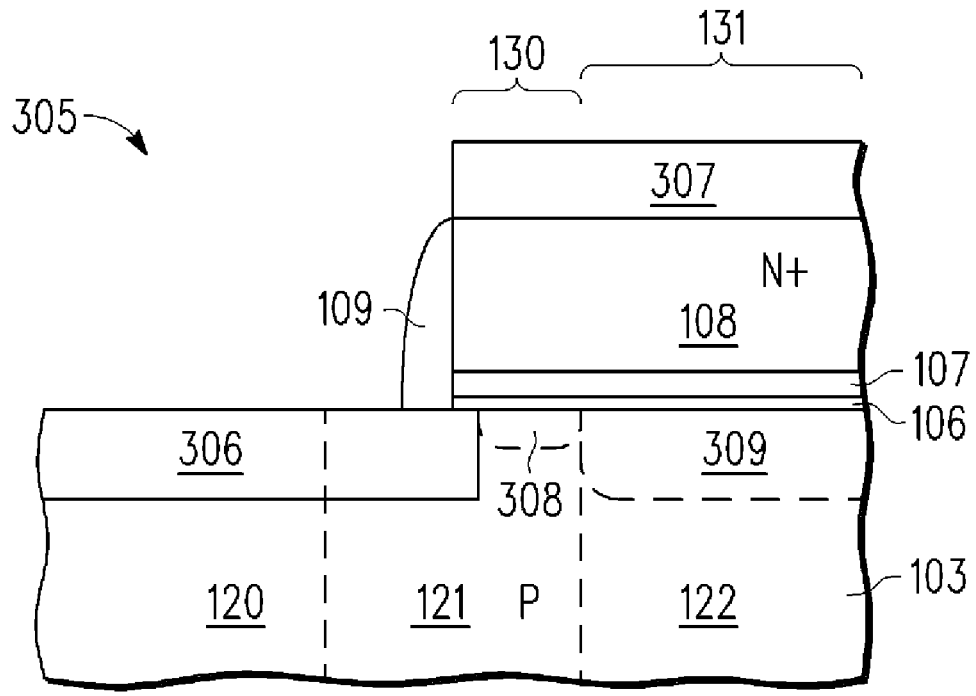
FIG. 10 illustrates processing subsequent to FIG. 9 after a silicide region is formed that encroaches deep inside the amorphized open body access region.

This silicide encroachment is shown in FIG. 10 which illustrates processing of the semiconductor wafer structure 305 subsequent to FIG. 9 after silicide regions 306, 307 are formed over the body contact region 120 and etched gate electrode 107, 108, respectively. In particular, after removing the patterned implant mask or photoresist layer 201 and forming a silicide mask (not shown) to define mask openings over the intended silicide regions, silicide regions 306, 307 are then formed using any desired silicide formation sequence. For example, silicide regions may be formed by first removing any oxide liner layer from the intended silicide regions, followed by depositing or sputtering a conductive or metal layer (e.g., nickel, cobalt, platinum, or a metallic alloy including one of the foregoing) over the semiconductor wafer structure 305 to a predetermined thickness (e.g., approximately 70-90 Angstroms). Next, the conductive or metal layer reacts with the underlying semiconductor material to form the silicide regions 306, 307. In an illustrative embodiment, the reaction of the conductive or metal layer and the underlying semiconductor regions is promoted by performing an initial rapid thermal anneal step (e.g., 400-600° C.), followed by a Piranha clean step to remove the metal from the exposed surfaces of the underlying semiconductor regions, and then followed by a second rapid thermal anneal step (e.g., 650-850° C.). The timing and temperature of the initial rapid thermal anneal step are selected so that the conductive or metal layer reacts with the exposed surfaces of the underlying semiconductor regions, but not with the sidewall spacers 109 or the isolation structures 105. As a result, reacted silicide regions 306, 307 may be formed after the initial rapid thermal anneal step on the exposed surfaces of the semiconductor layer 103 and polysilicon layer 108 (as well as the source/ drain regions 110, 111). After the Piranha clean step, the timing and temperature of the second rapid thermal anneal step are selected so that the reacted silicide 306, 307 is pushed into a low resistivity phase. In addition, amorphous structure of the implanted region 302 effectively increases the thickness of the silicide region 306 so that the silicide region 306 encroaches deep inside the amorphized open body access region 121, thereby reducing the body resistance by shrinking the size of the depletion region 308.

Figure 11:
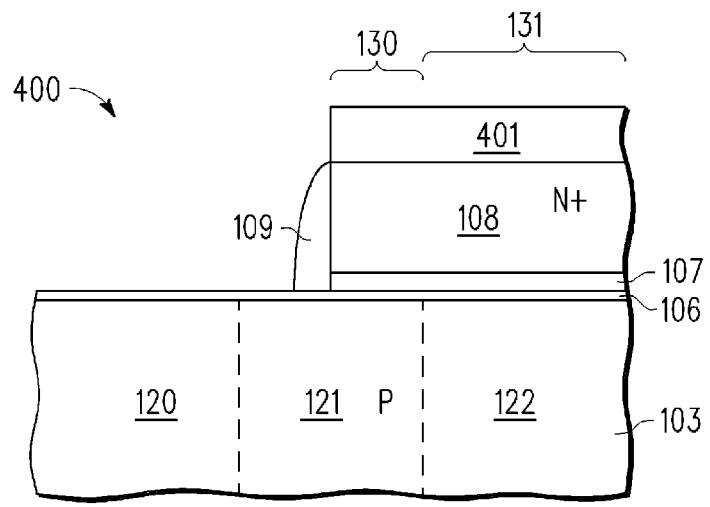
FIG. 11 illustrates processing subsequent to FIG. 5 in accordance with selected alternate embodiments after a patterned etch mask is formed over the semiconductor wafer structure to protect the metal gate layer.

Turning now to FIG. 11, there is illustrated processing of the semiconductor wafer structure 400 subsequent to FIG. 5 in accordance with selected embodiments after a patterned etch mask or photoresist layer 401 is formed to protect the etched gate electrode 107, 108. As formed, the etch mask layer 401 defines an opening to expose at least part of the body contact region 120 of the semiconductor layer 103 for subsequent etching. As will be appreciated, the patterned etch mask layer 401 may be formed by depositing and selectively etching one or more masking layers (e.g., a pad oxide and nitride layer) to completely cover and protect the polysilicon layer 108 in the etched gate electrode.

Though not shown at this point in the process, the semiconductor wafer structure 400 may be selectively implanted to amorphize part of the open body access region 121 to promote subsequent silicide encroachment. For example, the exposed portions of the semiconductor wafer structure 400 may be amorphized with an implantation of a heavy ion species that is implanted at an angle to form an amorphized implant region that extends laterally into the body access region 121. The angled implantation of amorphizing ions helps the subsequently formed silicide regions to extend the body contact region 120 laterally into the body access region 121.

Figure 12:
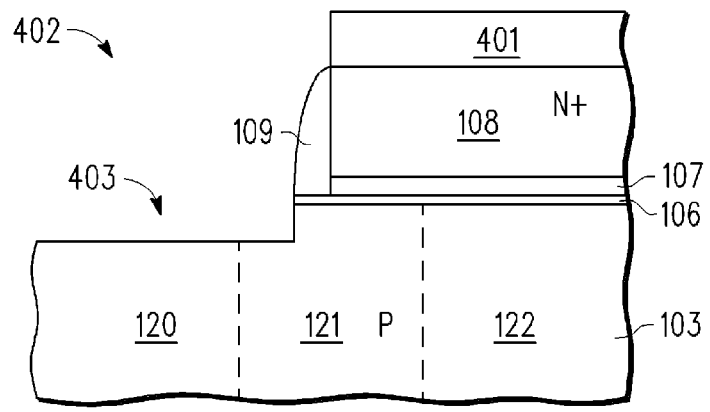
FIG. 12 illustrates processing subsequent to FIG. 11 after selectively recessing part of the body access region.

Turning now to FIG. 12, there is illustrated processing of the semiconductor wafer structure 402 subsequent to FIG. 11 where the patterned etch mask 401 is used to selectively etch or recess part of the body contact region 120 and the body access region 121. In particular, one or more active etch processes may be performed to create a body contact recess 403 in the body contact region 120 of the semiconductor layer 103 by selectively etching the exposed dielectric layer 106 and underlying semiconductor layer 103 over the body contact region 120. In selected embodiments, the body contact region 120 is etched using one or more reactive-ion etching processes that are controlled and applied to be highly selective between the semiconductor layer 103 in the body contact region 120, and the dielectric materials, such as the etch mask layer 401 (e.g., silicon nitride), the isolation structure(s) 105 (e.g., silicon oxide), and the sidewall spacers 109. As depicted in FIG. 12, the recessing etch process(es) may be relatively anisotropic so that the depth of recess opening 402 exceeds the amount of lateral etching. In addition, it will be appreciated that the semiconductor etch process, such as a dry etch process, will be assisted if the intended etch region has previously been amorphized with an angled amorphizing implant process.

Figure 13:
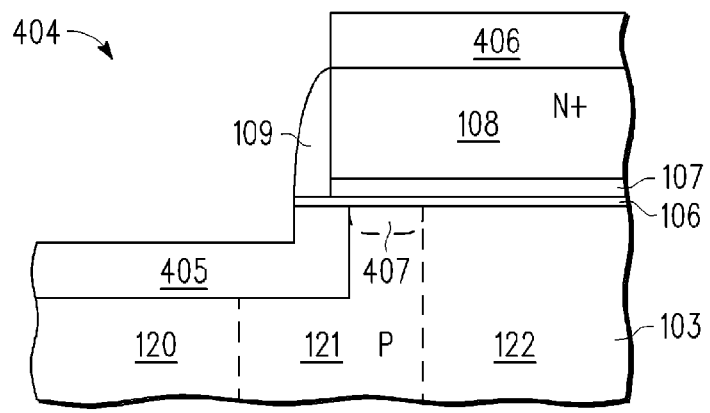
FIG. 13 illustrates processing subsequent to FIG. 12 after a silicide region is formed that encroaches deep inside the amorphized open body access region.

Turning now to FIG. 13, there is illustrated processing of the semiconductor wafer structure 404 subsequent to FIG. 12 after silicide regions 405, 406 are formed over the body contact region 120 and etched gate electrode 107, 108, respectively. In particular, after removing the patterned etch mask or photoresist layer 401 and forming a silicide mask (not shown) to define mask openings over the intended silicide regions, silicide regions 405, 406 are formed using any desired silicide formation sequence. For example, silicide regions may be formed by cleaning the intended silicide regions, depositing or sputtering a conductive or metal layer to a predetermined thickness, and then heating the semiconductor wafer structure 404 to react the conductive/metal layer with the underlying semiconductor material to form the silicide regions 405, 406. In addition, if an amorphizing implant has been performed, the structure of the implanted region effectively increases the thickness of the silicide region 405 so that the silicide region 405 encroaches deep inside the amorphized open body access region 121, thereby reducing the body resistance by shrinking the size of the depletion region 407.

It will be appreciated that additional processing steps will be used to complete the fabrication of the semiconductor structures into functioning transistors or devices. As examples, one or more sacrificial oxide formation, stripping, isolation region formation, well region formation, extension implant, halo implant, spacer formation, source/drain implant, heat drive or anneal steps, and polishing steps may be performed, along with conventional backend processing (not depicted), typically including formation of multiple levels of interconnect layers, vias and metal contacts that are used to connect the transistors in a desired manner to achieve the desired functionality. Thus, the specific sequence of steps used to complete the fabrication of the semiconductor structures may vary, depending on the process and/or design requirements.

By now, it should be appreciated that there has been provided herein a method for forming a body contacted semiconductor-on-insulator transistor. In the disclosed methodology, a first semiconductor layer (e.g., silicon) is formed over an insulating layer (e.g., a buried oxide layer), where the first semiconductor layer comprises a body contact region, a body access region that is adjacent to the body contact region, and an active region that is adjacent to the body access region. In addition, one or more semiconductor-on-insulator transistors are formed in the active region by forming an etched metal gate structure over the first semiconductor layer. As will be appreciated, the SOI transistor(s) may be formed by etching a gate stack (that includes a high-k dielectric layer, a metal-based layer, and a polysilicon layer) to form the etched metal gate structure having exposed gate sidewalls, followed by formation of sidewall spacers on the gate sidewalls, and then implantation of at least part of the source and drain regions in the active region using the etched metal gate structure and the sidewall spacers as an implant mask. As formed, the etched metal gate structure includes a first portion formed over the active region with source and drain regions formed in the active region on opposite sides of the first portion. The etched metal gate structure also includes a second portion formed over at least part of the body access region. After forming the etched metal gate structure, ions are implanted at a non-perpendicular angle into an implant region in the body access region to encroach under the second portion of the etched metal gate structure. In selected embodiments, dopant ions are implanted into at least a part of the second portion of the etched metal gate structure to counter-dope the second portion of the etched metal gate structure to have an opposite conductivity type from the first portion of the etched metal gate structure, thereby reducing formation of a depletion region in the body access region. In other embodiments, heavy ions or dopant ions are selectively implanted into the implant region at a non-perpendicular angle using an implant mask to protect the active region. For example, when implanting Xe, Ge, Ar, In, Sb, As, P, $BF_2$, Si, or another heavy amorphizing ion, the implant region is amorphized to encroach toward the active region. With these preparation sequences, silicide may be formed over the etched metal gate structure, the body contact region, and the implant region, thereby reducing formation of a depletion region in the body access region. In addition, at least part of the body contact region and the body access region may be partially recessed prior to forming silicide so that silicide is formed in the body access region to encroach under the second portion of the etched metal gate structure. In selected embodiments, the recess may be formed by selectively implanting at least part of the body contact region and the body access region to form an amorphized region, and then selectively etching the amorphized region to form a recess opening in the body contact region and the body access region, all prior to forming silicide over the etched metal gate structure, the body contact region, and the implant region.

In another form, there is provided a method of making a semiconductor device. In the disclosed methodology, a substrate is provided that has an insulating layer and an overlying semiconductor layer. In the semiconductor layer, an active region is doped or implanted to a first conductivity level, an adjacent body access region is doped or implanted to a second conductivity level, and an adjacent a body contact region is doped or implanted to a third conductivity level, where the conductivity levels may be the same or different from one another. After doping the semiconductor layer regions, a first gate insulating layer, metal-based layer, and polysilicon gate layer are sequentially formed on top of the semiconductor layer, and then selectively etched to form an etched metal gate structure having a first portion overlying the active region with source and drain regions formed in the active region on opposite sides of the first portion, and a second portion formed over at least part of the body access region. At this point, a mask layer may be formed over part of the etched metal gate structure to expose part of the second portion of the etched metal gate structure to subsequent implantation, or alternatively to protect the entirety of the etched metal gate structure from subsequent implantation. After forming the etched metal gate structure, ions are implanted at a non-perpendicular angle into an implant region in the body access region to encroach under the second portion of the etched metal gate structure. In selected embodiments, dopant ions are implanted into at least a part of the second portion of the etched metal gate structure to counter-dope the second portion of the etched metal gate structure to have an opposite conductivity type from the first portion of the etched metal gate structure, thereby reducing formation of a depletion region in the body access region. In other embodiments, heavy ions or dopant ions are selectively implanted into the implant region at a non-perpendicular angle using an implant mask to protect the active region. In still further embodiments, at least part of the body contact region and the body access region may be partially recessed prior to forming silicide so that silicide is formed in the body access region to encroach under the second portion of the etched metal gate structure. The partial recess may be formed by selectively implanting at least part of the body contact region and the body access region to form an amorphized region, and then selectively etching the amorphized region to form a recess opening in the body contact region and the body access region, all prior to forming silicide over the etched metal gate structure, the body contact region, and the implant region. The implanted ions prepare the semiconductor layer for the formation of silicide over the etched metal gate structure, the body contact region, and the implant region, thereby reducing formation of a depletion region in the body access region.

In yet another form, there is provided a method of forming a silicon-on-insulator transistor. As disclosed, an insulated substrate is formed with a defined active region (e.g., by forming shallow trench isolation regions) which defines a location of the silicon-on-insulator transistor. In the insulated substrate, an active region is doped or implanted to a first conductivity level, an adjacent body access region is doped or implanted to a second conductivity level, and an adjacent a body contact region is doped or implanted to a third conductivity level, where the conductivity levels may be the same or different from one another. On the insulated substrate, a high-k gate dielectric layer is formed, followed by the deposition and patterning of a metal gate electrode to define an etched metal gate electrode having a first portion overlying the active region, and a second portion formed over at least part of the body access region. After forming sidewall spacers on the etched metal gate electrode to overlie at least part of the body access region, source and drain regions are formed in the active region on opposite sides of the first portion of the etched metal gate electrode. Thereafter, ions are implanted at a non-perpendicular angle into an implant region in the body access region to encroach under the second portion of the etched metal gate electrode, and silicide is formed over the etched metal gate electrode, the body contact region, and the implant region, thereby reducing formation of a depletion region in the body access region. In selected embodiments, dopant ions are implanted into at least a part of the second portion of the etched metal gate electrode to counter-dope the second portion of the etched metal gate electrode to have an opposite conductivity type from the first portion of the etched metal gate electrode, thereby reducing formation of a depletion region in the body access region. In other embodiments, heavy ions or dopant ions are selectively implanted into the implant region at a non-perpendicular angle using an implant mask to protect the active region. In still further embodiments, at least part of the body contact region and the body access region may be partially recessed prior to forming silicide so that silicide is formed in the body access region to encroach under the second portion of the etched metal gate electrode.

Although the described exemplary embodiments disclosed herein are directed to various semiconductor device structures and methods for making same, the present invention is not necessarily limited to the example embodiments which illustrate inventive aspects of the present invention that are applicable to a wide variety of semiconductor processes and/or devices. Thus, the particular embodiments disclosed above are illustrative only and should not be taken as limitations upon the present invention, as the invention may be modified and practiced in different but equivalent manners apparent to those skilled in the art having the benefit of the teachings herein. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method for forming a body contacted semiconductor-on-insulator transistor comprising:
   providing a first semiconductor layer over an insulating layer, where the first semiconductor layer comprises a body contact region, a body access region that is adjacent to the body contact region, and an active region that is adjacent to the body access region;
   forming a semiconductor-on-insulator transistor in the active region by forming an etched metal gate structure over the first semiconductor layer, where the etched metal gate structure comprises:
      a first portion formed over the active region with source and drain regions formed in the active region on opposite sides of the first portion, and
      a second portion formed over at least part of the body access region;
   implanting ions at a non-perpendicular angle into an implant region in the body access region to encroach under the second portion of the etched metal gate structure; and
   forming silicide over the etched metal gate structure, the body contact region, and the implant region.

2. The method of claim 1, further comprising selectively forming a mask layer over part of the etched metal gate structure prior to implanting ions at a non-perpendicular angle, thereby exposing at least part of the second portion of the etched metal gate structure.

3. The method of claim 1, where providing a first semiconductor layer comprises providing a silicon layer over a buried oxide layer which is located on a silicon substrate layer.

4. The method of claim 1, where forming a semiconductor-on-insulator transistor comprises:
   etching a gate stack comprising a high-k dielectric layer formed on the first semiconductor layer, a metal-based layer formed on the high-k dielectric layer, and a polysilicon layer formed on the metal-based layer to form the etched metal gate structure having exposed gate sidewalls;
   forming sidewall spacers on the exposed gate sidewalls of the etched metal gate structure; and
   implanting at least part of the source and drain regions in the active region using the etched metal gate structure and the sidewall spacers as an implant mask.

5. The method of claim 1, where implanting ions at a non-perpendicular angle comprises implanting dopant ions into at least a part of the second portion of the etched metal gate structure to counter-dope the second portion of the etched metal gate structure to have an opposite conductivity type from the first portion of the etched metal gate structure, thereby reducing formation of a depletion region in the body access region.

6. The method of claim 1, where implanting ions comprises selectively implanting heavy ions into the implant region at a non-perpendicular angle using an implant mask to protect the active region.

7. The method of claim 1, where implanting ions comprises selectively implanting dopant ions into the implant region at a non-perpendicular angle using an implant mask to protect the active region.

8. The method of claim 1, where implanting ions comprises implanting the implant region at a non-perpendicular angle with Xe, Ge, Ar, In, Sb, As, P, $BF_2$, Si, or another amorphizing ion, thereby amorphizing the implant region to encroach toward the active region.

9. The method of claim 1, further comprising partially recessing at least part of the body contact region and the body access region prior to forming silicide so that silicide is formed in the body access region to encroach under the second portion of the etched metal gate structure.

10. The method of claim 9, where partially recessing at least part of the body contact region and the body access region comprises:
    selectively implanting at least part of the body contact region and the body access region to form an amorphized region; and
    selectively etching the amorphized region to form a recess opening in the body contact region and the body access region, all prior to forming silicide over the etched metal gate structure, the body contact region, and the implant region.

11. A method of making a semiconductor device, comprising:
    providing a substrate having a semiconductor layer and an insulating layer, wherein the semiconductor layer has a top surface and overlies the insulating layer;
    doping an active region of the semiconductor layer to a first conductivity level;
    doping a body access region of the semiconductor layer that is adjacent to the active region to a second conductivity level;
    doping a body contact region of the semiconductor layer that is adjacent to the body access region to a third conductivity level;
    forming a first gate insulating layer on the top surface;
    forming a polysilicon gate layer over the first gate insulating layer;
    selectively etching the polysilicon gate layer to form an etched gate structure having a first portion overlying the active region with source and drain regions formed in the active region on opposite sides of the first portion, and a second portion formed over at least part of the body access region;
    implanting ions at a non-perpendicular angle into an implant region in the body access region to encroach under the second portion of the etched gate structure; and
    forming silicide over the etched gate structure, the body contact region, and the implant region.

12. The method of claim 11, further comprising selectively forming a mask layer over part of the etched gate structure prior to implanting ions at a non-perpendicular angle, thereby exposing at least part of the second portion of the etched gate structure to implantation.

13. The method of claim 11, where implanting ions at a non-perpendicular angle comprises implanting dopant ions into at least a part of the second portion of the etched gate structure to counter-dope the second portion of the etched gate structure to have an opposite conductivity type from the first portion of the etched gate structure, thereby reducing formation of a depletion region in the body access region.

14. The method of claim 11, where implanting ions comprises selectively implanting heavy ions or dopant ions into the implant region at a non-perpendicular angle using an implant mask to protect the active region.

15. The method of claim 11, further comprising partially recessing at least part of the body contact region and the body access region prior to forming silicide so that silicide is formed in the body access region to encroach under the second portion of the etched gate structure.

16. The method of claim 15, where partially recessing at least part of the body contact region and the body access region comprises:

selectively implanting at least part of the body contact region and the body access region to form an amorphized region; and selectively etching the amorphized region to form a recess opening in the body contact region and the body access region, all prior to forming silicide over the etched gate structure, the body contact region, and the implant region.

17. A method of forming a silicon-on-insulator transistor comprising:

forming an insulated substrate;

defining an active region in the insulated substrate which defines a location of the silicon-on-insulator transistor;

doping the active region to a first conductivity level;

doping a body access region of insulated substrate that is adjacent to the active region to a second conductivity level;

doping a body contact region of the insulated substrate that is adjacent to the body access region to a third conductivity level;

forming a high-k gate dielectric layer over the insulated substrate;

depositing and patterning a metal gate electrode comprising a metal-based layer and a polysilicon layer to define an etched metal gate electrode having a first portion overlying the active region, and a second portion formed over at least part of the body access region forming sidewall spacers on the etched metal gate electrode to overlie at least part of the body access region;

forming source and drain regions in the active region on opposite sides of the first portion of the etched metal gate electrode;

implanting ions at a non-perpendicular angle into an implant region in the body access region to encroach under the second portion of the etched metal gate electrode; and forming silicide over the etched metal gate electrode, the body contact region, and the implant region.

18. The method of claim 17, where implanting ions at a non-perpendicular angle comprises implanting dopant ions into at least a part of the second portion of the etched metal gate electrode to counter-dope the second portion of the etched metal gate electrode to have an opposite conductivity type from the first portion of the etched metal gate electrode, thereby reducing formation of a depletion region in the body access region.

19. The method of claim 11, where implanting ions comprises selectively implanting heavy ions or dopant ions into the implant region at a non-perpendicular angle, thereby amorphizing the implant region to encroach toward the active region.

20. The method of claim 11, further comprising partially recessing at least part of the body contact region and the body access region prior to forming silicide so that silicide is formed in the body access region to encroach under the second portion of the etched metal gate electrode.

* * * * *